United States Patent [19]

Lein

[11] Patent Number: 5,395,257
[45] Date of Patent: Mar. 7, 1995

[54] FAULT-TOLERANT CONNECTOR
[75] Inventor: Steven H. Lein, Bloomington, Minn.
[73] Assignee: Honeywell Inc., Minneapolis, Minn.
[21] Appl. No.: 99,791
[22] Filed: Jul. 30, 1993
[51] Int. Cl.⁶ ............................................. H01R 13/652
[52] U.S. Cl. .................................... 439/108; 361/772
[58] Field of Search ......................... 439/92, 101, 108;
361/760, 772, 773, 774

[56] References Cited

U.S. PATENT DOCUMENTS 5,224,867  7/1993  Ohtsuki et al. ........................ 439/108
5,238,414  8/1993  Yaegashi et al. ...................... 439/108

Primary Examiner—Gary F. Paumen
Attorney, Agent, or Firm—Robert A. Pajak

[57] ABSTRACT

In the present invention, fault containment module signals are assigned to the pins so that a band of guard pins connected to ground exists between the signal pins belonging to each fault containment module. Thus, a bent pin or foreign contaminant can only cause a short to ground or to another pin assigned to the same fault containment module, thereby diminishing the chance that bent pins and foreign contaminants will cause interference between the signals from different fault containment modules.

4 Claims, 1 Drawing Sheet

FAULT-TOLERANT CONNECTOR

BACKGROUND OF THE INVENTION

1. Field of the Invention

This invention relates to fault-tolerant systems employing electrical connectors. More particularly, it relates to the arrangement of connector pin assignments to enhance fault isolation.

2. Description of the Related Art

One fault-tolerant hardware design strategy for an aircraft navigation/control system is to partition the system into functional areas, sometimes referred to as "fault containment areas", provide redundancy for each area, and provide signal crossfeed and fault detection and isolation at each functional area boundary, for example, at the bus interface. Some examples of these functional areas include accelerometer data systems, a gyroscope data system, processor systems, power supply, power supply monitoring, system clock, and the like.

A fault-tolerant system as just described is configured so that each functional area contains redundant circuit subsystems, each responding to identical inputs, providing identical functions, and therefore providing identical outputs. Thus, if any one or more, but not all, of the redundant subsystems fail, the remaining subsystem or subsystems will continue to function normally so that the overall aircraft navigation/control system may continue to operate, as is well understood in fault-tolerant systems. Herein, such a redundant subsystem is referred to as a "fault containment module".

A fault-tolerant system as described above, like other large electronic systems, commonly employs a plurality of circuit card assemblies, each having a multi-pin connector for insertion into a mating connector on a master interconnect printed wiring board, sometimes referred to as a "mother board."

When multi-pin connectors are used to connect the circuit card assemblies to the mother board, there is a possibility that during insertion of the pins into their sockets, a pin will become bent and will contact an adjacent pin. It is also possible for foreign contaminants to bridge adjacent pins or sockets. In fault-tolerant systems, it is important that a failure of any kind should always be limited to only one fault containment module. That is, if a pin assigned to one fault containment module is bent, then only the fault containment module requiring the electrical signal of that pin should fail, and no others. When this requirement is met, the fault containment modules are said to be isolated from each other.

Previously, in order to provide such isolation, the practice was to use one electrical connector for each interface between fault containment modules. One fault containment module could therefore have its output signals going to several different connectors, and its input signals coming from several more connectors. This resulted in the uneconomical use of many separate connectors. Also, in order to maintain the integrity of the fault isolation in some systems of the prior art using this multi-connector scheme, a circuit card assembly could only contain one fault containment module.

SUMMARY OF THE INVENTION

An object of the present invention is to provide a method of assigning signals to a connector of a circuit card assembly and mother board utilized in a fault-tolerant system which permits more than one fault containment module or functional area to be contained on one printed wiring board assembly having a common connector while still maintaining fault isolation.

Another object of the present invention is to provide a circuit card assembly having redundant electrical systems having signal input/output electrically connected to a common connector which provides fault isolation between the electrical systems resident thereon as well as between redundant external electrical systems also connected to the resident electrical systems.

In the present invention, fault containment module signals are assigned to the pins so that a band of guard pins connected to ground exists between the signal pins belonging to each fault containment module. Thus, a bent pin or foreign contaminant can only cause a short to ground or to another pin assigned to the same fault containment module, thereby diminishing the chance that bent pins and foreign contaminants will cause interference between the signals from different fault containment modules.

DESCRIPTION OF THE PREFERRED EMBODIMENT

Figure 1:
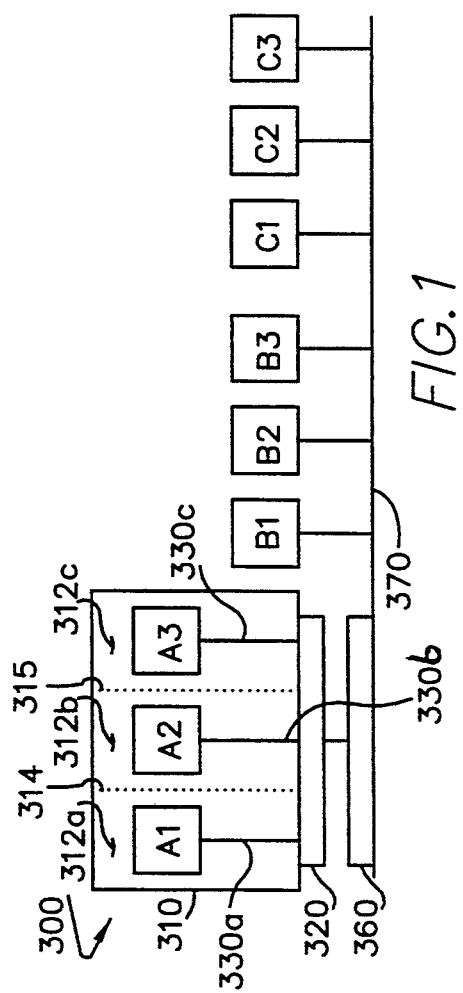
FIG. 1 is a block diagram of a circuit card assembly having a plurality of fault containment modules.

Illustrated in FIG. 1 is a circuit card assembly 300 including a printed wiring board 310 and connector 320. Printed wiring board 310 includes three distinct areas 312a–c, where area 312a is separated from area 312b by dotted reference line 314, and area 312b is separated from area 312c by dotted reference line 315.

Within each area 312a–c is an electrical subsystem referred to as a "fault containment module". These modules are designated in FIG. 1 as A1, A2, A3. Each of these modules are comprised of a plurality of electrical circuit components generally soldered to printed wiring board electrical conductors (not shown) for interconnection among the components, receiving input signals (including power supply), and providing output signals. The input/output signals are electrically connected to a multi-pin circuit card connector 320 common in the art and generally illustrated in FIG. 2. The input/output electrical signal interconnections between the fault containment module components of A1, A2, A3 and the connector 320 are designated by numerals 330a, 330b and 330c, respectively. These electrical signal interconnections 330a, 330b and 330c are also provided by printed wiring board conductors (not shown) and represent one or more signal lines.

In the following exposition it is of paramount importance to distinguish between signals of different fault containment modules either of the same or different functional areas. Referring to FIG. 1, circuit card assembly 300 provides three fault containment modules having the same function as designated by the prefix "A". Circuit card assembly 300 is shown having its connector 320 connected to the mating connector 360 of mother board 370. Connected to mother board 370 by connectors (not shown) are other redundant fault containment modules B1, B2, B3, C1, C2, C3, etc.

Each fault containment module includes power supply signals as well as input and output signals. Some of these signals are referred to as "resident signals". Each signal is defined as a resident signal for one and only one fault containment module; it "belongs" to that module, and is therefore foreign to every other fault containment module.

Here resident and foreign signals are defined according to their ability to cause a fault containment module to lose the ability to function. For a given fault containment module, a resident signal is a signal the failure of which will cause loss of ability to function only in that fault containment module, and not in any other module. A foreign signal is a signal the failure of which will cause loss of ability to function in some other fault containment module, and not in the module in question. Loss of ability to function is defined as a fault containment module's inability to produce the correct output given the correct input. Thus, a module's power input and all its output signals are usually considered resident, while all its other input signals are usually considered foreign.

The invention is a method of separating groups of signals belonging to different fault containment modules by placing ground pins between them. Specifically, the invention is to assign pins on a multi-pin connector so that there is always a ground pin directly between a pin assigned to one fault containment module and any pin assigned to another fault containment module which the first pin could touch by becoming bent; here a pin assigned to a module means a pin which carries a signal which is resident to that module.

Figure 2:
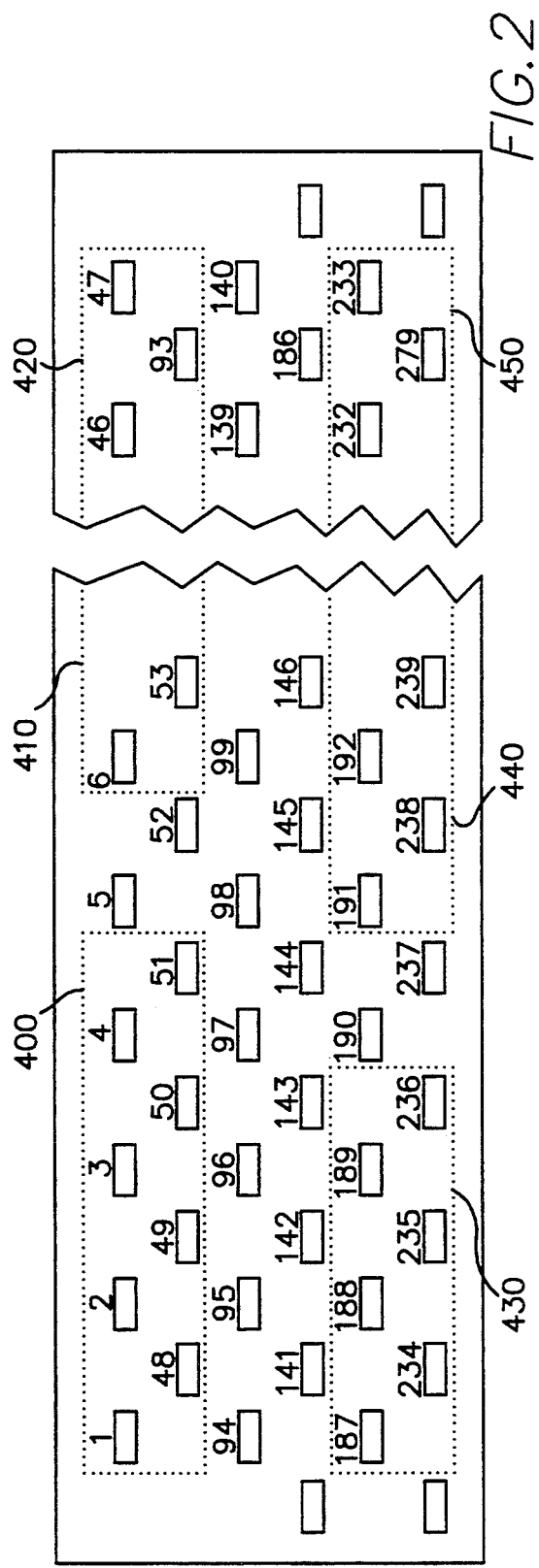
FIG. 2 is a representation of an electrical connector for illustrating electrical signal assignments in accordance with the present invention.

This method is illustrated on the 283-pin connector in FIG. 2. The connector has six staggered rows of 0.17-inch-long pins, with 0.05 inches between the rows. The pins in the outer rows, pins 1–93 and 187–279, are assigned primarily to active signals from fault containment modules. These assignments are shown by the labeled boxes enclosing groups of pins. Because one of these outer pins, if bent, may contact any pin in the two adjacent rows, the pins in the center two rows, pins 94–186, are assigned primarily to ground. Some of these central pins may be used for board testing or other purposes if the adjacent pins in the outer rows are not being used for active signals:

Each fault containment module is assigned a block of pins in the top two or bottom two rows. Because a bent pin may contact pins in the adjacent two columns (e.g. pin 51 may contact pins 4, 5, 50, and 52), each block of assigned pins must be isolated from an adjacent block of signal pins by at least two grounded pins. For example, if one fault containment module is assigned to pins 1–4 and 48–51 (block 400), pins 5 and 52 must be grounded, and the next fault containment module may be assigned pins starting at 6 and 53 (block 410). Blocks 420–450 are similarly isolated from each other and from blocks 400 and 410.

Although a 0.17-inch-long bent pin could seemingly contact a pin three rows or three columns away, in fact it cannot because the pin must bend with a certain radius, which will generally be close to the thickness of the pin. Here the dimensions of the pins are 0.030 inches by 0.018 inches, so the maximum "reach" of a pin is 0.170−0.018=0.152 inches, which is not long enough to reach a pin three rows or columns away.

While the above discussion concerns a 283-pin connector with a particular arrangement of pins, the same principle of maintaining a band of guard pins around each block of active signal pins may be used for a multi-pin connector with a different arrangement of pins.

I claim:

1. A method of electrically connecting electrical conductors on a circuit card assembly and electrical conductors on a master interconnect board to pin-socket connections of mating ones of multi-signal plug connectors, wherein one of said multi-signal plug connectors includes a plurality of signal pins of known length, and wherein said circuit card assembly includes a plurality of electrical circuit systems configured to be fault containment modules, and wherein electrical signals associated with electrical conductors associated with one of said fault containment modules are designated as resident, and wherein electrical signals associated with electrical conductors associated with the remaining ones of said plurality of fault containment modules are designated as foreign, the method including the steps of:

separately connecting selected ones of said pin-socket connections to selected ones of said electrical conductors of said fault containment modules on said circuit card assembly;

connecting selected ones of said pin-socket connections to a common selected electric potential;

separately connecting selected ones of said pin-socket connections to selected ones of said electrical conductors of said master interconnect board; and wherein, the spatial arrangement of said pin-socket connections is such that, for each one of said signal pins connected to one of said electrical conductors carrying a resident signal, those signal pins which are (i) within a distance equal to the length of said signal pin carrying said resident signal and (ii) electrically connected to either an electric potential or passes an electrical signal there through, are connected to an electrical conductor which is connected to a selected one of said common electric potential and one of said electrical conductors carrying another resident signal.

2. A method of electrically connecting electrical conductors on a circuit card assembly and electrical conductors on a master interconnect board to pin-socket connections of mating ones of multi-signal plug connectors, wherein said circuit card assembly includes a plurality of electrical circuit systems configured to be fault containment modules, and wherein signals associated with electrical conductors associated with one of said fault containment modules are designated as resident, and wherein electrical signals associated with electrical conductors associated with the remaining ones of said plurality of fault containment modules are designated as foreign, the method including the steps of:

separately connecting selected ones of said pin-socket connections to selected ones of said electrical conductors of said fault containment modules on said circuit card assembly;

connecting selected ones of said pin-socket connections to a common selected electric potential;

separately connecting selected ones of said pin-socket connections to said electrical conductors of said master interconnect board; and wherein, the spatial arrangement of said pin-socket connections is such that, for any of said pin-socket connections electrically connected to one of said electrical conductors which carries a resident signal, those pin-socket connections which are (i) radially adjacent to said connections carrying said resident signal and (ii) electrically connected to either an electric potential or passes an electrical signal there through, are each connected to a selected one of said common electric potential and one of said electrical conductors carrying a resident signal.

3. A fault-tolerant connector assembly comprising;

a circuit card assembly including a plurality of electrical circuit systems configured to be fault containment modules, a plurality of electrical conductors connected to said fault containment modules, wherein electrical signals associated with electrical conductors associated with one of said fault containment modules are designated as resident, and wherein electrical signals associated with electrical conductors associated with the remaining ones of said plurality of fault containment modules are designated as foreign, and a multi-signal plug connector;

a master interconnect board including a plurality of electrical conductors for carrying electrical signals from fault containment modules and a multi-signal plug connector adapted for mating with said multi-signal plug connector of said circuit card assembly in a pin-socket arrangement, and wherein, said multi-signal plug connectors have a plurality of pin-socket connections electrically connected selectively to said electrical conductors of said circuit card assembly and selectively to said electrical conductors of said master interconnect board, and wherein one of said multi-signal plug connectors includes a plurality of signal pins of known length, and wherein the spatial arrangement of said signal pins is such that, for each one of said signal pins connected to one of said electrical conductors carrying a resident signal, those signal pins (i) which are within a distance equal to the length of said signal pin carrying said resident signal and (ii) which are electrically connected to either an electric potential or passes an electrical signal there through, are connected to an electrical conductor which is connected to a selected one of said common electric potential and one of said electrical conductors carrying another resident signal.

4. A fault-tolerant connector assembly comprising:

a circuit card assembly including a plurality of electrical circuit systems configured to be fault containment modules, a plurality of electrical conductors electrically connected to said fault containment modules, wherein electrical signals associated with electrical conductors associated with one of said fault containment modules are designated as resident, and wherein electrical signals associated with electrical conductors associated with the remaining ones of said plurality of fault containment modules are designated as foreign, and a multi-signal plug connector;

a master interconnect board including a plurality of electrical conductors for carrying electrical signals from fault containment modules and a multi-signal plug connector adapted for mating with said multi-signal plug connector of said circuit card assembly in a pin-socket arrangement; and wherein, said multi-signal plug connectors have a plurality of pin-socket connections electrically connected selectively to said electrical conductors of said circuit card assembly and selectively to said electrical conductors of said master interconnect board, and wherein one of said multi-signal plug connectors includes a plurality of signal pins of known length, and wherein the spatial arrangement of said signal pins is such that, for each one of said signal pins connected to one of said electrical conductors carrying a resident signal, those signal pins (i) which are radially adjacent to said signal pin carrying said resident signal and (ii) which are electrically connected to either an electric potential or passes an electrical signal there through, are connected to an electrical conductor which is connected to a selected one of said common electric potential and one of said electrical conductors carrying another resident signal.

* * * * *